United States Patent [19]

Petsch

[11] 4,399,486
[45] Aug. 16, 1983

[54] TRANSISTOR CONTROL UNIT FOR A SERVO MOTOR

[75] Inventor: Johann Petsch, Poing, Fed. Rep. of Germany

[73] Assignee: A.S.R. Servotron AG, Geneva, Switzerland

[21] Appl. No.: 260,759

[22] Filed: May 5, 1981

[30] Foreign Application Priority Data

Aug. 19, 1980 [DE] Fed. Rep. of Germany ....... 3031287

[51] Int. Cl.³ .............................................. H05K 7/20
[52] U.S. Cl. .................................... 361/386; 363/141; 361/383
[58] Field of Search ................ 363/141; 361/381–384, 361/386–389, 399, 400, 417–420; 174/16 R, 16 HS; 165/80 R, 80 A, 80 B, 80 D

[56] References Cited

U.S. PATENT DOCUMENTS 3,059,153 10/1962 Shaffer .
3,228,091 1/1966 Rice et al. .
3,780,798 12/1973 Reimer ................................ 361/383
4,027,206 5/1977 Lee ...................................... 361/384
4,177,499 12/1979 Volkmann ........................... 361/386

FOREIGN PATENT DOCUMENTS 1850463 4/1962 Fed. Rep. of Germany .
1850856 5/1962 Fed. Rep. of Germany .
2725340 12/1978 Fed. Rep. of Germany ...... 361/386
1480825 7/1977 United Kingdom .
1552317 9/1979 United Kingdom .

OTHER PUBLICATIONS

BBC-Nachrichten, 1978, H. 7, pp. 281–282.
Rim Electronic Jahrbuch, 1979, pp. 40–43, 52–53, 90, 94–95, 98–100, 124–125, 145–146, 276.

*Primary Examiner*—G. P. Tolin
*Attorney, Agent, or Firm*—Stevens, Davis, Miller & Mosher

[57] ABSTRACT

A transistor control unit for a servo motor has its control part and its power part arranged on a single printed circuit element. The control part and a cooling body, power transistors and power diodes of the power part are located side-by-side on one side of the element, the current connections being on the other side. Resistance arrays in flat rectangular housings are mounted end-on on the element with their main surfaces vertical when the element is mounted in position.

9 Claims, 4 Drawing Figures

TRANSISTOR CONTROL UNIT FOR A SERVO MOTOR

The invention relates to a transistor control unit for a servo motor, with an electronic control part which consists of components which are arranged on one face of a printed circuit element.

Control units of this kind, which are used for the exact speed and positional control of servo motors, particularly of the permanent magnet type, in machine tools or in other machines of a very wide variety, afford, as is well known, appreciable advantages as compared with the thyristor phase angle control systems which have previously been conventional. In contradistinction to these thyristor phase angle control systems, control is exercised by d.c. pulse width modulation through the use of power transistors. However, the known transistor control units are expensive to manufacture and assemble; this is above all attributable to the fact that the power part, with the cooling body which is required at higher power ratings, has to be mounted separately from the printed element of the control part (usually a control element in the form of a double Euro-Card) and has to be wired to the control part.

Underlying this invention is the object of providing a control unit of the above-stated kind, preferably for a continuous power rating of at least 2 kW or for a peak power rating of 6 kW, which control unit requires appreciably less expenditure in manufacture and assembly than has hitherto been the case, so that this control unit is better suited for large production runs.

According to the invention there is provided a transistor control unit for a servo motor, with an electronic control part which consists of components, which are arranged on one face of a printed circuit element of the double Euro-Card type, these components including a number of driver transistors for an end stage, integrated circuits, and a plurality of resistances, with a printed circuit on the rear face of the element, and with a power part, which is spatially separated from the control part and substantially consists of a number of power transistors which are mounted on a cooling body together with associated power diodes, the cooling body, the transistors and with the associated diodes being arranged on the same printed card and being disposed on the same side of this element, as the components of the control part and to the side of the control part; the current flow connections leading from the power part to the control part being printed current flow guide paths disposed on the rear face of the printed element; and, in each instance, a number of resistances, the value of each of which is similar or identical, of the control part being arranged as resistance arrays in flat, rectangular housings, which are disposed, on the printed element, with their main surfaces extending vertically.

The invention has the advantage that only the printed circuit connections pattern of one double Euro-Card is required for establishing the circuit connections both of the control part and also of the power part. At the same time the use of a separate supporting and securing structure for the power part is dispensed with. In order to make space (which was lacking in the case of the known control units) for the power part on the Euro-Card, not all the components of the control part now correspond, in type and disposition, to those previously used. The necessary space is, in particular, created by the provision of vertically positioning the resistance arrays and, preferably, through adopting further measures such as the use of transistor arrays and by combining a number of amplifiers in common dual-in-line housings. The control unit can now be manufacturered in large production runs, appreciably more cheaply than hitherto, this increased cheapness corresponding to the reduced cost of production and assembly.

An additional advantage accrues from the saving in space at the point of use of the control part, as the thickness dimension of this control part is appreciably reduced in comparison with all known comparable control units. For a given control space on a machine a correspondingly greater number of servo motors can therefore be controlled.

Embodiments of the invention will now be described with reference to the accompanying drawings, in which.

Figure 1:
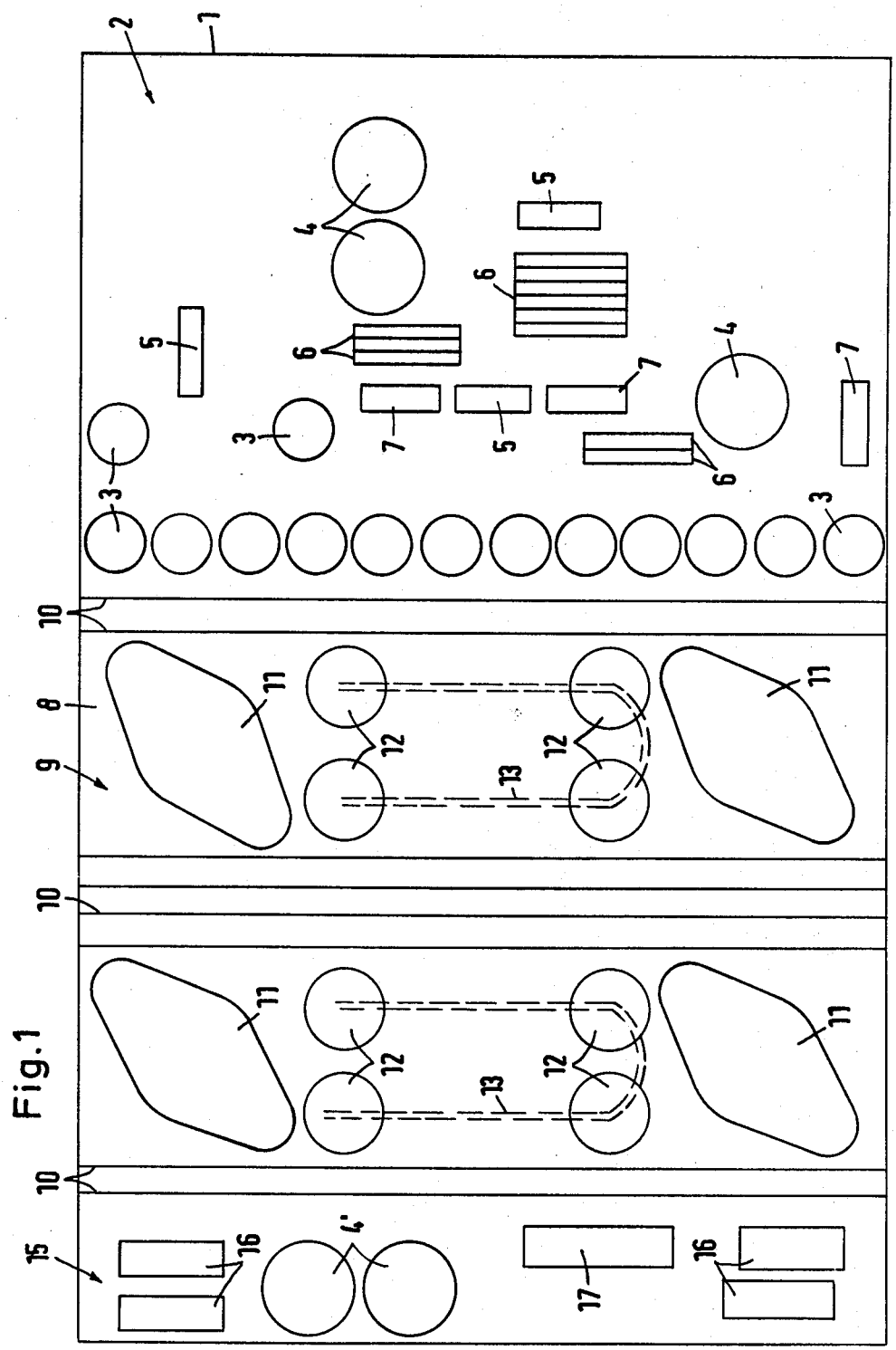
FIG. 1 represents the printed element and part of the latter's components, in plan view.
Figure 2:
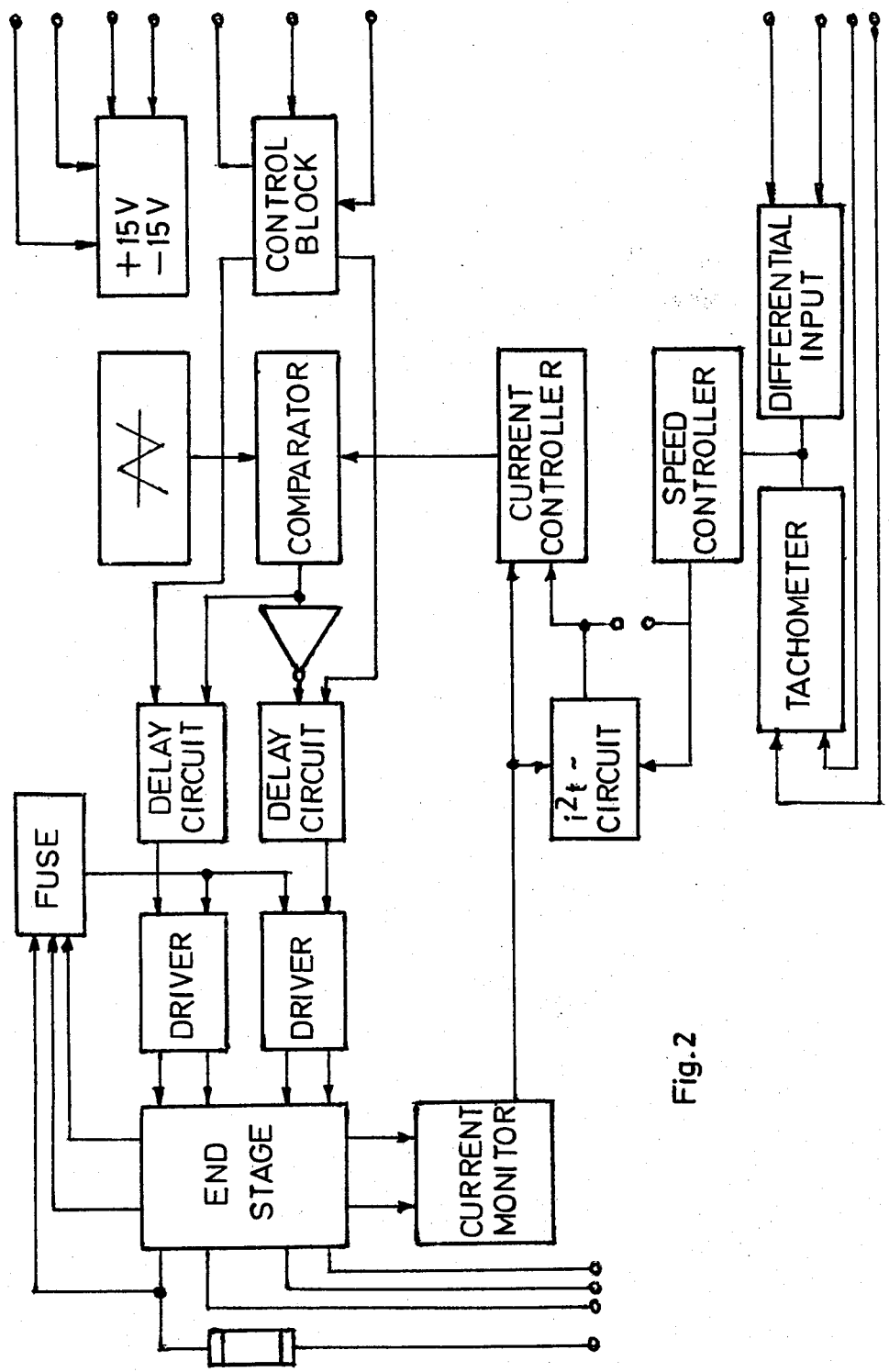
FIG. 2 is a block circuit diagram of the control unit.

The circuit arrangement shown in the block circuit diagram of FIG. 2 can be seen, in FIG. 1, on the printed element 1, which is in the form of a conventional double Euro-Card and shows only those components which are essential to the invention. This printed card 1 is illustrated in its approximately natural size (when substantially filling an A4 sheet). As this circuit arrangement is known per se, it does not require any further description here.

The spatial disposition of the components, required for the circuit arrangement shown in FIG. 2, on the printed element 1 are of interest for explaining the present invention. As is clear from the drawing, substantially the whole control part 2 lies on a relatively short length (approximately 10 cm) of the printed card 1; the circuits for supplying control voltage, the conventional fuse circuits, and the speed-and armature current-controllers, with the driver transistors, belong to this control part 2. The driver transistors are designated as 3; 4 indicates capacitors of the control part; 5 designates transistor arrays of a kind known per se and in the form of integrated circuits; and 7 designates the housings, each of which is common to a number of operational amplifiers associated with this housing and in the form of integrated circuits. Reference symbol 6 designates resistance networks or arrays, also known per se in flat rectangular housings. The surfaces in the area 2 which are represented in the drawing as unoccupied are in truth fully occupied with further conventional components. These components are mainly discrete resistances of the conventional cylindrical shape. Also, a few further integrated circuits have been omitted from the drawing for the sake of simplicity.

Resistance arrays 6, which for example may be of the commercially available type 784-3-R- (from the firm Beckman Instruments) and, for example, are only 2 mm thick in the case of a main surface of the housing of about 8×20 mm, are arranged with their main surfaces extending vertically on the printed card 1. Eight (for example) connecting conductors pass from the narrow face of the resistance arrays 6 and pass to the printed circuit on the rear face of the printed card (FIG. 3), thus establishing the necessary electrical connections. As is clear from the drawing, additional space saving is realised by arranging for a plurality of resistance arrays 6—in the embodiment illustrated two, three and six of these arrays are shown—to have their main surfaces in mutual abutment and to be thus combined to form blocks of resistance arrays. Naturally, however, individual resistance arrays could be provided. The resistances of the control part, which are used for the resistance arrays 6, all have resistance values which are similar or identical to one another, and also, all have relatively small power ratings.

The transistor arrays 5, in the form of 14-pole dual in-line housings for example, may for example be of the type TBA 331 (from the firm Thomson CSF). The space saving achieved by the use of these components is not only the result of the appreciably smaller size of their transistors in comparison with a corresponding number of discrete transistors, but also of the smaller space needed for their voltage supply. A further space saving is realised by combining, in each of the housings 7 of the conventional dual-in-line type, a number of operational amplifiers of the control part 2. The components used may for example be components of type TL 084 (from the firm Texas Instruments). Hitherto, only housings with a single amplifier have been used in the control units of the type used with the present invention.

The relatively large cylindrical electrolytic capacitors 4 are disposed vertically for the sake of saving space. As is clear from the drawing, twelve of the discrete driver transistors 3 form a straight line which extends the whole width of the printed card or plate 1, this row of transistors 3 reaching almost as far as the cooling body 8 of the power part 9 of the control unit of this embodiment.

The cooling body 8, which consists of a metal plate of the width of the printed card 1 and is approximately of the same length, in the longitudinal direction of the printed card 1, as the control part 2, lies laterally to the side of this control part 2 on the component face of the printed card 1. This cooling body 8 may have, in a manner known per se, two transversely extending cooling ribs 10 at each end and, in its centre, four transversely extending cooling ribs 10. Components of the power part 9, that is to say of the end stage of the control unit, are accommodated in the two spaces defined between the end and centre cooling ribs 10. These components are in the form of four (for example) power transistors 11 and the diodes 12, which serve as free-running diodes. These diodes 12 are interconnected by the U-shaped wires shown as 13.

Figure 3:
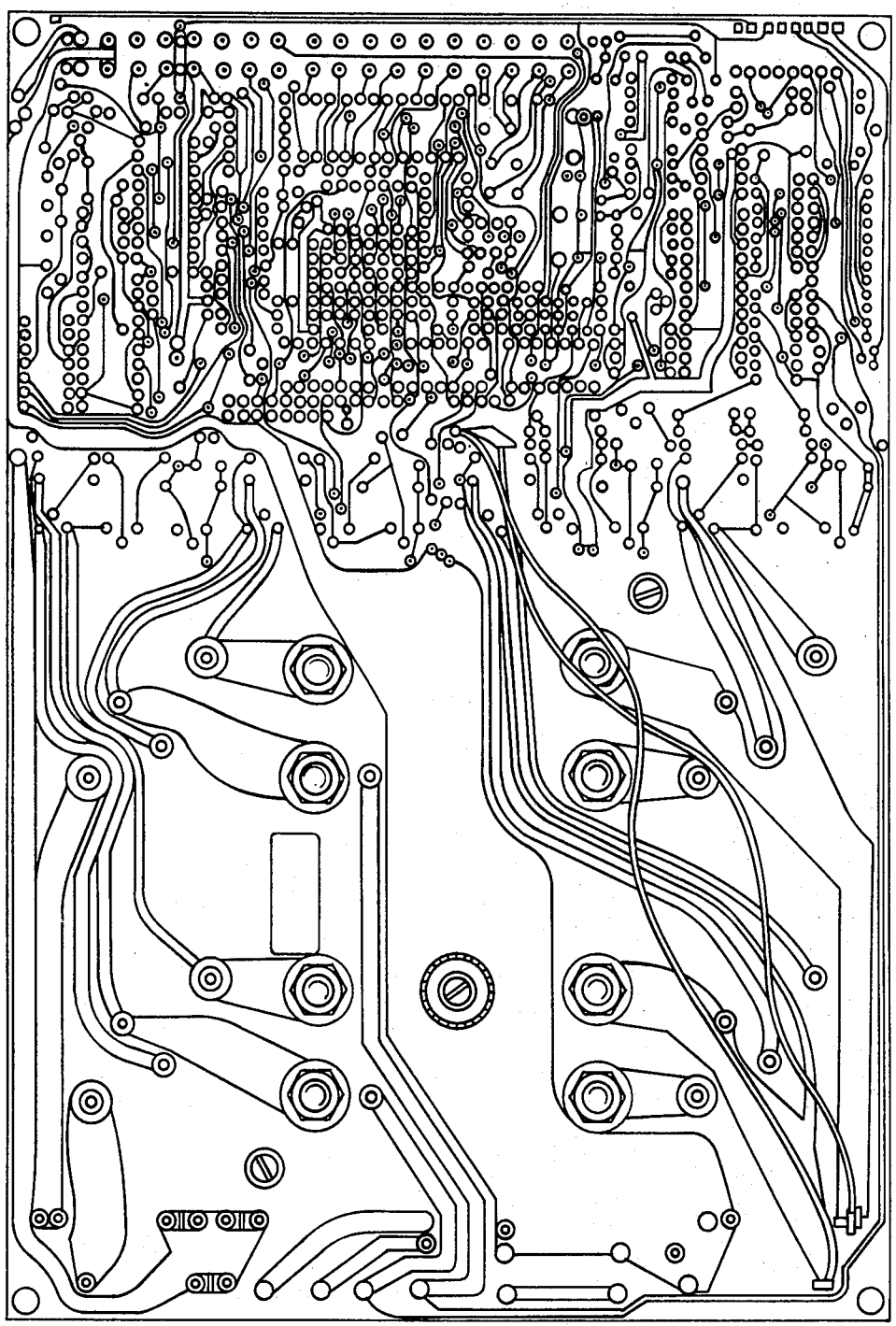
FIG. 3 is a photographically exact copy of the pattern of electrical circuit connections on the rear face of the printed element.

The symmetrical disposition, shown in the drawing, of the power transistors 11 and diodes 12 relative to the centre longitudinal axis of the printed card and relative to the centre cooling ribs 10 is favourable for promoting a space-saving pattern of printed electrical circuit connections on the rear face of the printed card 1 (cf. FIG. 3). In each instance the power transistors 11 and the diodes 12 arranged between them, lie in side-by-side relation in the longitudinal direction of the printed card.

The power part 9 preferably lies between the area, approximately of the same size as this power part 9, of the control part 2, and a substantially narrower, further area 15 lying at the other end of the printed card. A number of further components of the control unit may be accommodated in this area 15, such as further capacitors 4' positioned with their longitudinal axis extending vertically, relatively large resistances 16, which serve as measuring resistances for measuring actual (i.e. instantaneous) values, and a protective device or fuse 17.

The details of the printed circuit of the control unit on the rear face of the printed card 1 will be readily clear to those versed in the art from FIG. 3. The electrical circuit connections, i.e. conductors of the power part 9 lie in the right-hand half of this figure. In the case of the embodiment described with reference to FIGS. 1 to 3, attachment of the control unit is established by means of screw clips. The control unit itself is, in the equipment concerned, secured by means of screws, which pass through holes in the corners of the printed plate of the Euro-Card (FIG. 3).

Figure 4:
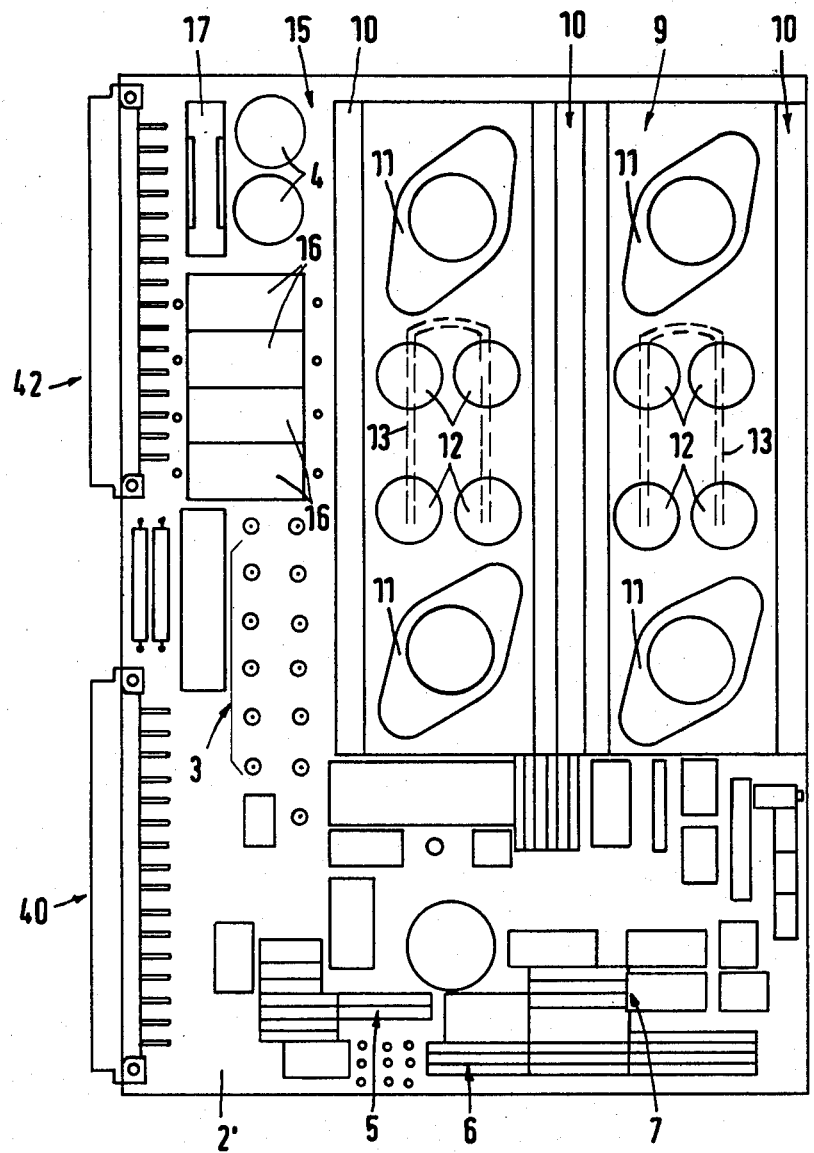
FIG. 4 is a plan view of a printed element in accordance with a further embodiment of the present invention.

The embodiment shown in FIG. 4 is a plug-in modification, that is to say attachment is established by means of plug-in strips 40, 42, which are arranged on one of the longitudinal sides of the Euro-Card. The embodiment shown in FIG. 4 further differs from that illustrated in FIG. 1 in the sense that the control part 2' is of approximately L-shape, this L-shaped part 2' lying contiguously with the longitudinal side of the card, which is provided with the plug-in devices 40, 42, and of the (when assembly takes place) lower, shorter side of the card. The power part occupies a rectangular area which lies in the right-hand upper part of FIG. 4. When the card has been assembled, the power transistors 11, the diodes 12 and the cooling bodies 10 extend vertically, that is to say the arrangement corresponds to that of FIG. 1, with the result that satisfactory cooling and minimal heat transference to the components of the control part are ensured.

The driver transistors 3 are arranged, in two rows extending parallel to the longitudinal side of the card, in the part of the L-shaped area lying contiguously with the plug-in devices 40, 42. Furthermore, identical reference symbols have been given to corresponding components in FIGS. 1 and 4. Thus, above the driver transistors 3 are the current measurement resistances 16, the smoothing capacitors 4 and a protective device or fuse 17. The transistor arrays 5, the resistance arrays 6 and the integrated circuits 7 are positioned in that part of the L-shaped area which lies contiguously with the lower, short face of the printed card.

What is claimed is:

1. A transistor control unit for a servo motor, which comprises: an electronic control part which in turn comprises components arranged on one face of a printed circuit element, these components including a number of driver transistors for an end state, integrated circuits, and a plurality of resistances, with a printed circuit on the rear face of the element; and a power part, which is spatially separated from the control part and comprises a number power transistors which are mounted on a cooling body together with associated power diodes, the cooling body, the transistors and the associated diodes being arranged on the same printed circuit element and being disposed on the same side thereof as the components of the control part and to the side of the control part; the current flow connections leading from the power part to the control part being printed current flow guide paths disposed on the rear face of the printed card; a number of resistances, the value of each of which is similar or identical, of the control part being arranged as resistance arrays in flat, rectangular housings, which are disposed, on the printed circuit element, with their main surfaces extending vertically, pluralities of rectangular housings being juxtasposed to one another with their main surfaces in mutual abutment so as to form at least blocks of resistance arrays, each block comprising at least two said housings.

2. A control unit according to claim 1, wherein a number of transistors of the control part are arranged as a transistor array in the form of an integrated circuit in a dual-in-line housing.

3. A control unit according to claim 1, wherein, a number of operational amplifiers of the control part are constituted as an integrated circuit in a common dual-in-line housing.

4. A control unit according to claim 1, wherein the power part is arranged in two groups of at least two power transistors and diodes, which groups are separated by cooling ribs which extend transversely of the longitudinal direction of the printed element and, in each group a power transistor, lying on the outer plate edge, and two diodes, which lie side by side in the longitudinal direction of the circuit element, are disposed symmetrically to either side of the centre, longitudinal axis of the circuit element.

5. A control unit according to claim 1, wherein the power part lies between the area of the control part, which area is of approximately the same size as that of the power part, and an appreciably smaller, further area positioned at the other end of the printed circuit element, further components being arranged in this further area.

6. A control unit according to claim 1, wherein the control part occupies a substantially L-shaped portion of the printed circuit element.

7. A control unit according to claim 6, wherein the L-shaped area is bounded by a longitudinal edge of the printed circuit element which is provided with a plug-in device and by one of the short edges of the printed circuit element.

8. A control unit according to claim 6, wherein the power part is constituted by two groups, which are separated by cooling ribs extending in the longitudinal direction of the printed element, each of which groups has at least two power transistors with four diodes arranged between them.

9. A control unit according to claim 6, wherein at least one row of driver transistors is arranged in a part of the L-shaped area which lies contiguously with one of the longitudinal edges of the printed circuit element, and extends parallel to this longitudinal edge.

* * * * *